(12) United States Patent
Rahul et al.

(10) Patent No.: US 10,979,034 B1
(45) Date of Patent: Apr. 13, 2021

(54) METHOD AND APPARATUS FOR MULTI-VOLTAGE DOMAIN SEQUENTIAL ELEMENTS

(71) Applicant: Xilinx, Inc., San Jose, CA (US)

(72) Inventors: Kumar Rahul, Hyderabad (IN); Santosh Yachareni, Hyderabad (IN); Jitendra Kumar Yadav, Hyderabad (IN); Md Nadeem Iqbal, Katihar (IN); Teja Masina, Hyderabad (IN); Sourabh Swarnkar, Hyderabad (IN); Suresh Babu Kotha, Hyderabad (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/012,557

(22) Filed: Jun. 19, 2018

(51) Int. Cl.
*H03K 3/3562* (2006.01)
*H03K 3/012* (2006.01)
*H03K 3/037* (2006.01)
*H03K 19/0185* (2006.01)
*H03K 19/00* (2006.01)

(52) U.S. Cl.
CPC .......... *H03K 3/3562* (2013.01); *H03K 3/012* (2013.01); *H03K 3/0372* (2013.01); *H03K 19/0016* (2013.01); *H03K 19/018557* (2013.01)

(58) Field of Classification Search
CPC ............... H03K 3/3562; H03K 3/0372; H03K 19/018557; H03K 3/012; H03K 19/0016
See application file for complete search history.

(56) References Cited

U.S. PATENT DOCUMENTS

| | | | |
|---|---|---|---|
| 6,838,924 B1 | 1/2005 | Davies, Jr. | |
| 7,183,825 B2 * | 2/2007 | Padhye | G11C 5/147 327/202 |
| 8,502,585 B2 * | 8/2013 | Kuenemund | H03K 3/356008 327/208 |
| 9,813,047 B2 * | 11/2017 | Jayapal | H03K 3/356008 |
| 2004/0135611 A1 * | 7/2004 | Tohsche | H03K 3/012 327/218 |
| 2007/0133314 A1 * | 6/2007 | Chae | G11C 7/1051 365/189.05 |
| 2011/0037508 A1 * | 2/2011 | Lundberg | H03K 3/012 327/333 |
| 2014/0075087 A1 * | 3/2014 | Bartling | G06F 13/00 711/102 |
| 2014/0211893 A1 * | 7/2014 | Rasouli | H04L 7/0037 375/354 |
| 2015/0123723 A1 * | 5/2015 | Sharma | H03K 3/012 327/210 |
| 2016/0285439 A1 * | 9/2016 | Xie | H03K 3/35625 |
| 2018/0183422 A1 * | 6/2018 | Yasotharan | G06F 13/4282 |

* cited by examiner

*Primary Examiner* — Patrick C Chen
(74) *Attorney, Agent, or Firm* — Patterson + Sheridan, LLP

(57) ABSTRACT

A circuit includes a master latch circuit and a slave latch circuit. The master latch circuit is configured to receive an input data signal associated with an input data voltage domain and generate a first output data signal associated with an output data voltage domain different from the input data voltage domain. The slave latch circuit is configured to receive, from the master latch circuit, the first output data signal and generate a second output data associated with the output data voltage domain.

16 Claims, 11 Drawing Sheets

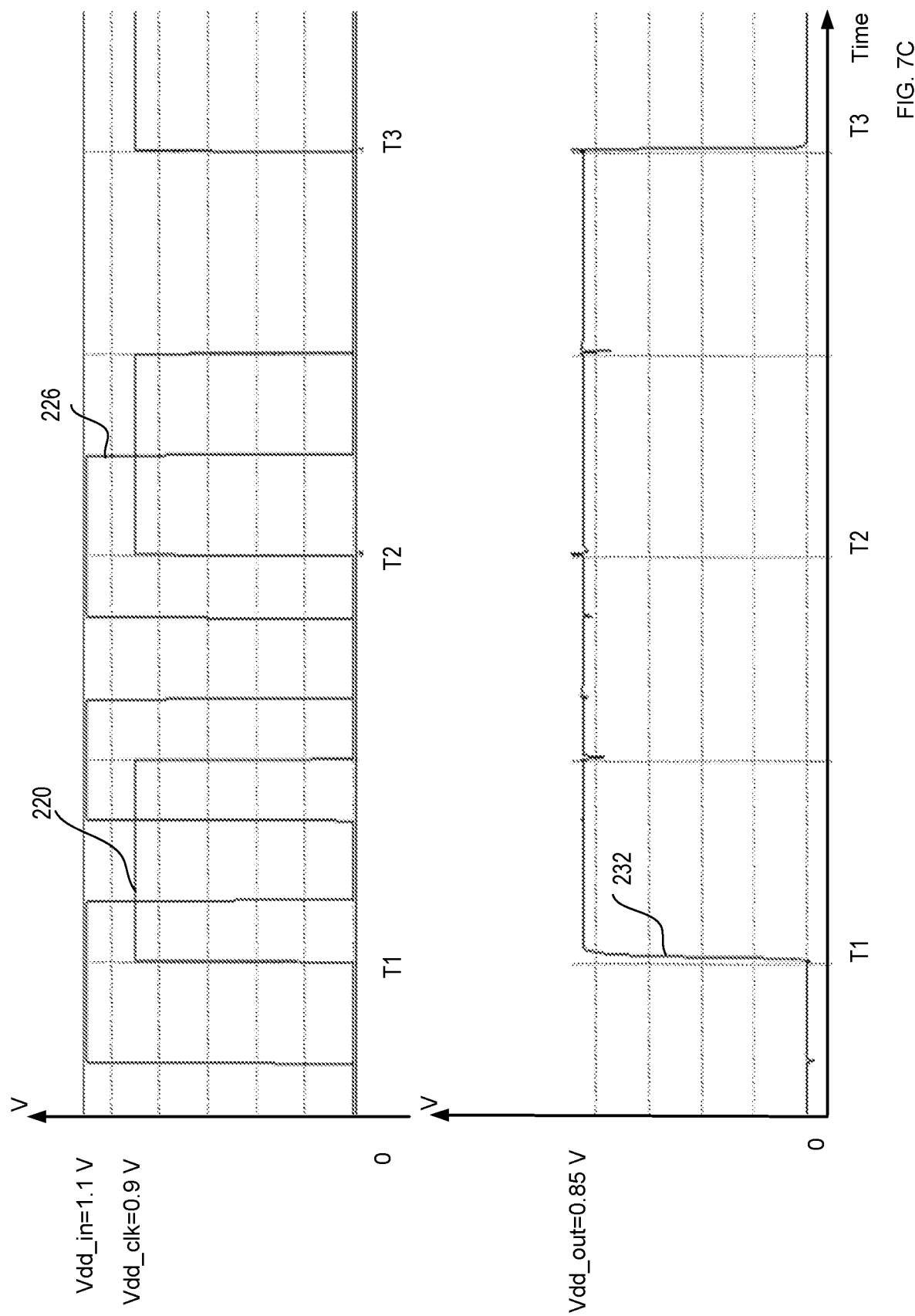

| Type | Setup (ps) | Hold (ps) |
|---|---|---|
| Separate LS for Clock & Input Data + FF | 35 | 0 |
| MDV FF 500 | 60 | 0 |
| MDV FF 600 | 30 | 0 |

FIG. 10

METHOD AND APPARATUS FOR MULTI-VOLTAGE DOMAIN SEQUENTIAL ELEMENTS

TECHNICAL FIELD

Examples of the present disclosure generally relate to integrated circuits ("ICs") and, in particular, to an embodiment related to multi-voltage domain (MVD) sequential elements.

BACKGROUND

One challenge in designing integrated circuits (ICs) is accommodating several different power supply voltages on a single IC. Typically, an IC will have a "core" power supply for powering the bulk of its internal circuitry. The voltage level of the core power supply is usually kept low in order to conserve power. As IC fabrication processes improve and the minimum feature size on an IC decreases, the allowable core voltage also decreases. For example, ICs fabricated using current IC processes may operate at approximately 1.0 V or less. Even lower voltages may be possible as process technology continues to improve. For particular applications, however, an IC may use one or more voltage levels in addition to the core voltage. For example, an IC may need to communicate with other components in a system using an input/output (I/O) standard that requires a particular voltage level for compliance (e.g., the TTL standard, which may require a voltage level of 3.3 V).

Accordingly, it would be desirable and useful to provide improved a method and system for performing cross voltage domain operations including latching and pipelining.

SUMMARY

In some embodiments, a circuit includes a master latch circuit and a slave latch circuit. The master latch circuit is configured to: receive an input data signal associated with an input data voltage domain; and generate a first output data signal associated with an output data voltage domain different from the input data voltage domain. The slave latch circuit is configured to: receive, from the master latch circuit, the first output data signal; and generate a second output data signal associated with the output data voltage domain.

In some embodiments, the master latch circuit is configured to receive a first clock signal associated with a clock voltage domain. The first output data signal is generated based on the first clock signal. The slave latch circuit is configured to receive an inverted signal of the first clock signal. The second output data signal is generated based on the inverted signal of the first clock signal In some embodiments, the clock voltage domain is different from at least one of the input data voltage domain and output data voltage domain.

In some embodiments, the master latch circuit includes: a resolving circuit configured to, in response to a low value of the first clock signal: provide, at a first output of the master latch circuit, the first output data signal that is logically equivalent to the input data signal; and provide, at a second output of the master latch circuit, an inverted signal of the first output data signal.

In some embodiments, the resolving circuit includes: first and second PMOS transistors connected in serial, wherein a drain of the first PMOS transistor is coupled to a source of the second PMOS transistor; and third and fourth PMOS transistors connected in serial. A drain of the third PMOS transistor is coupled to a source of the fourth PMOS transistor. A gate of the first PMOS transistor is coupled to a drain of the fourth PMOS transistor. A gate of the second PMOS transistor is coupled to the input data signal. A gate of the third PMOS transistor is coupled to a drain of the second PMOS transistor. A gate of the fourth PMOS transistor is coupled to an inverted signal of the input data signal. A source of the fourth PMOS transistor is coupled to the first output. A source of the second PMOS transistor is coupled to the second output.

In some embodiments, the resolving circuit includes: first and second NMOS transistors connected in serial, wherein a drain of the first NMOS transistor is coupled to the drain of the second PMOS transistor, and where a gate of the first NMOS transistor is coupled to an inverted signal of the first clock signal; third and fourth NMOS transistors connected in serial, wherein a drain of the third NMOS transistor is coupled to the drain of the fourth PMOS transistor.

In some embodiments, the master latch circuit includes: a first feedback circuit coupled to the second output and configured to: generate, using a first inverter, an inverted signal of the first output data signal; and a second feedback circuit coupled to the first output and configured to: generate, using a second inverter, an inverted signal of the second output data signal.

In some embodiments, at least one of the first feedback circuit and second feedback circuit is controlled by the first clock signal.

In some embodiments, each of the first inverter and second inverter is off when the first clock signal is low.

In some embodiments, at least one of the first, second, third, and fourth NMOS transistors has a size determined based on a size of a transistor of one of the first and second inverters.

In some embodiments, each of the first inverter and second inverter remains on during an entire clock cycle of the first clock signal.

In some embodiments, a latch circuit includes a data input configured to receive an input data signal associated with an input data voltage domain; a clock input configured to receive a clock signal associated with a clock voltage domain; and a first output configured to output a first output data signal associated with an output data voltage domain different from the input data voltage domain, wherein the first output data signal is generated based on the input data signal and clock signal; and wherein at least two of the input data voltage domain, clock voltage domain, and output data voltage domain are different.

In some embodiments, the latch circuit includes a resolving circuit configured to, when the clock signal is low: provide, at the first output, the first output data signal that is logically equivalent to the input data signal; and provide, at a second output, an inverted signal of the first output data signal.

In some embodiments, the resolving circuit includes: first and second PMOS transistors connected in serial, wherein a drain of the first PMOS transistor is coupled to a source of the second PMOS transistor; and third and fourth PMOS transistors connected in serial, wherein a drain of the third PMOS transistor is coupled to a source of the fourth PMOS transistor; wherein a gate of the first PMOS transistor is coupled to a drain of the fourth PMOS transistor, wherein a gate of the second PMOS transistor is coupled to the input data signal, wherein a gate of the third PMOS transistor is coupled to a drain of the second PMOS transistor, wherein a gate of the fourth PMOS transistor is coupled to an inverted signal of the input data signal, wherein a source of the fourth PMOS transistor is coupled to the first output, and wherein a source of the second PMOS transistor is coupled to the second output.

In some embodiments, the resolving circuit includes: first and second NMOS transistors connected in serial, wherein a drain of the first NMOS transistor is coupled to the drain of the second PMOS transistor, and where a gate of the first NMOS transistor is coupled to an inverted signal of the clock signal; and third and fourth NMOS transistors connected in serial, third and fourth NMOS transistors connected in serial, wherein a drain of the third NMOS transistor is coupled to the drain of the fourth PMOS transistor.

In some embodiments, the latch circuit includes a first feedback circuit coupled to the second output and configured to: generate, using a first inverter, an inverted signal of the first output data signal; and a second feedback circuit coupled to the first output and configured to: generate, using a second inverter, an inverted signal of the second output data signal.

In some embodiments, each of the first feedback circuit and second feedback circuit is controlled by the clock signal.

In some embodiments, each of the first inverter and second inverter remains on during an entire clock cycle of the clock signal.

In some embodiments, a method includes receiving, by a master latch circuit, an input data signal associated with an input data voltage domain; generating, by the master latch circuit, a first output data signal associated with an output data voltage domain different from the input data voltage domain; receiving, by a slave latch circuit from the master latch circuit, the first output data signal; and generating a second output data signal associated with the output data voltage domain.

In some embodiments, the method includes: receiving, by the master latch circuit, a first clock signal associated with a clock voltage domain, wherein the clock voltage domain is different from at least one of the input data voltage domain and output data voltage domain, and wherein the first output data signal is generated based on the first clock signal; and receiving, by the slave latch circuit, an inverted signal of the first clock signal, wherein the second output data signal is generated based the inverted signal of the first clock signal.

Other aspects and features will be evident from reading the following detailed description and accompanying drawings.

BRIEF DESCRIPTION OF THE DRAWINGS

FIGS. 7A, 7B, and 7C illustrate waveforms of signals of the MVD FF circuit 500 of FIG. 5 according to various embodiments of the present disclosure.

FIG. 10 is a table illustrating the comparison of setup time and hold time of MVD FF circuits of FIGS. 5 and 6 according to some embodiments of the present disclosure.

DETAILED DESCRIPTION

Figure 1:
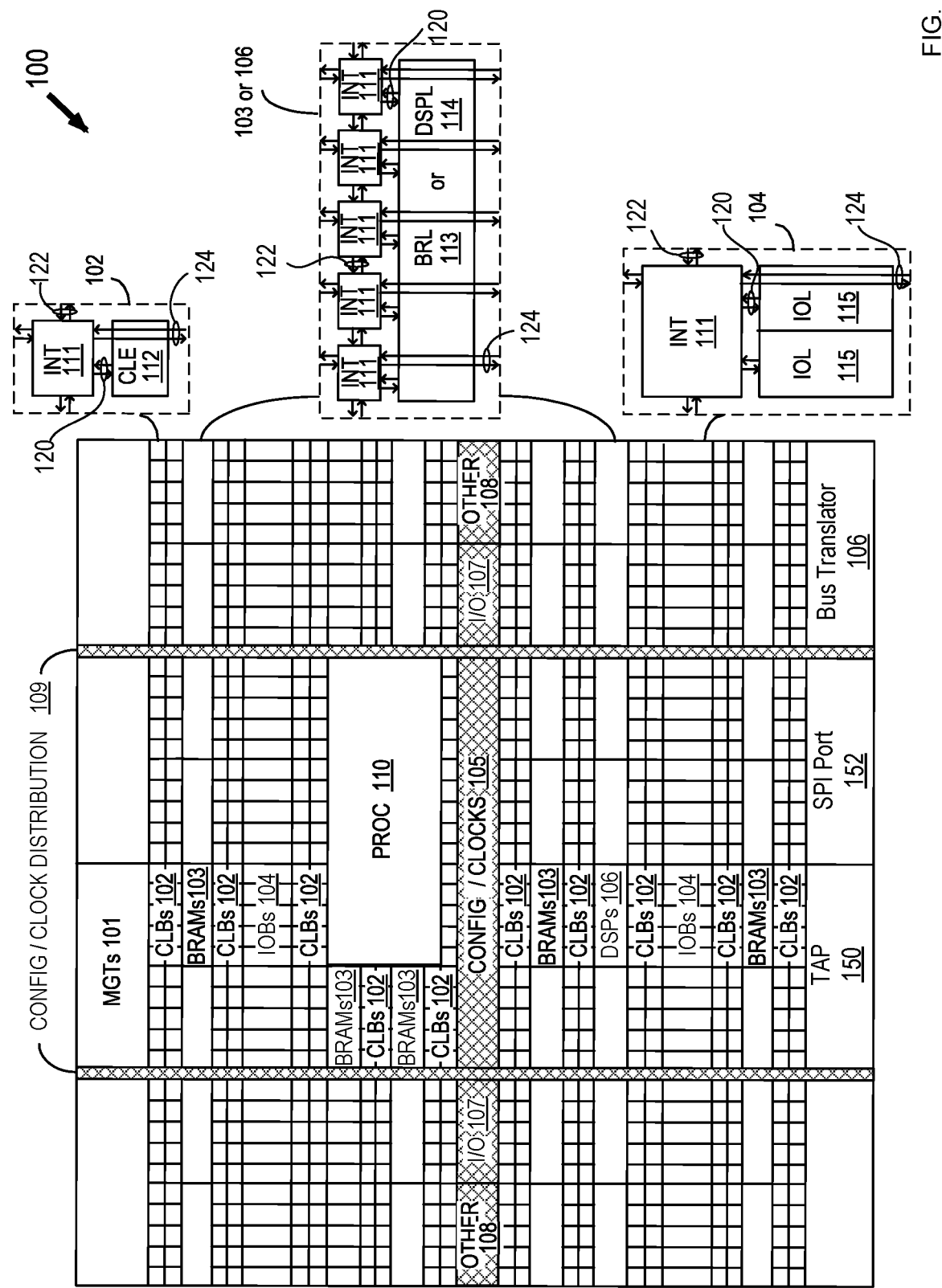
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. As discussed above, an IC may require the use of one or more voltage levels. For example, a circuit of the IC may receive a clock signal in a clock voltage domain and input data in an input data voltage domain, and provide an output signal including the latched data in an output data voltage domain. In that example, typically, two level shifters may be used to shift the clock signal and the input data signal to the output data voltage domain respectively. A separate FF may receive the shifted input data signal and the shifted clock signal that are both in the output data voltage domain, and output the latched data in the output data voltage domain. However, those two level shifters for shifting the clock signal and the input data signal to the output data voltage domain require additional areas and consume additional power. Those two level shifters may introduce a level shift delay in the data path.

For integrated circuit (IC) solutions, it has been discovered that by using an MVD sequential element, multi-voltage domain operations including latching and pipelining may be performed without using additional level shifters for shifting an input clock signal and/or an input data signal to an output data voltage domain. In various embodiments, a sequential element may generate an output that is a function of both its input and its present state. Examples of sequential elements include flip-flops, latches, and/or memory cells. An MVD sequential element may operate with a clock signal, a data input signal, and a data output signal that have the same or different voltage domains. Various advantages may be present in various applications of the present disclosure. No particular advantage is required for all embodiments, and different embodiments may offer different advantages. One of the advantages of some embodiments is that by eliminating level shifters in multi-domain voltage data latching, area and power savings are achieved. Another of the advantages of some embodiments is that by elimination level shifters in multi-domain voltage data latching, delay in the data path is reduced, which help to reduce the high setup number requirement on the data input. Yet another of the advantages of some embodiments is that the MVD FF is highly robust with process, voltage, and temperature (PVT) variation.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the error detection and correction is not limited to the exemplary IC depicted in FIG. 1, and that IC having other configurations, or other types of IC, may also implement the multi-voltage domain sequential element.

Figure 2:
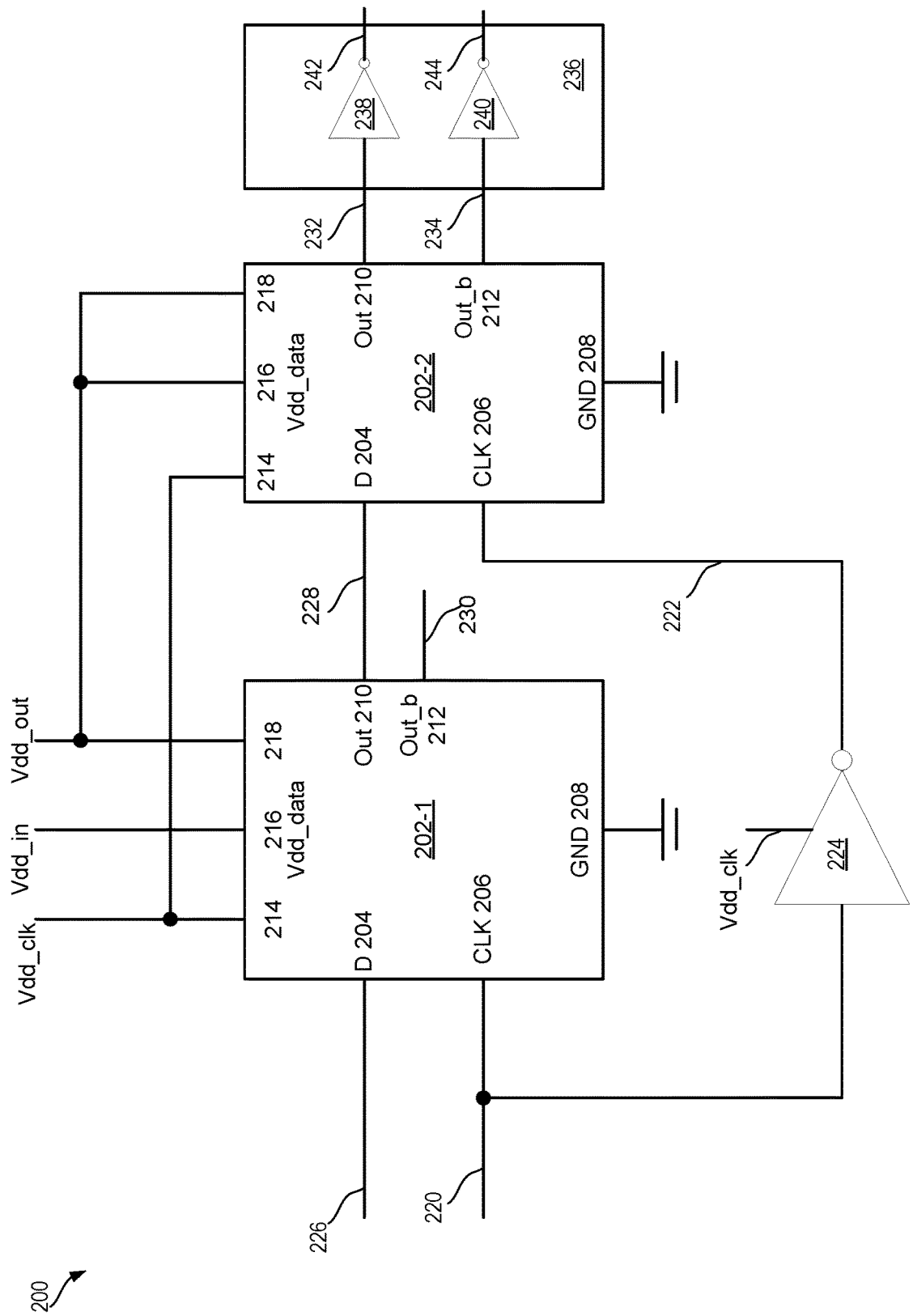
FIG. 2 is a block diagram illustrating an exemplary MVD flip-flop (FF) circuit according to some embodiments of the present disclosure.
Figure 3:
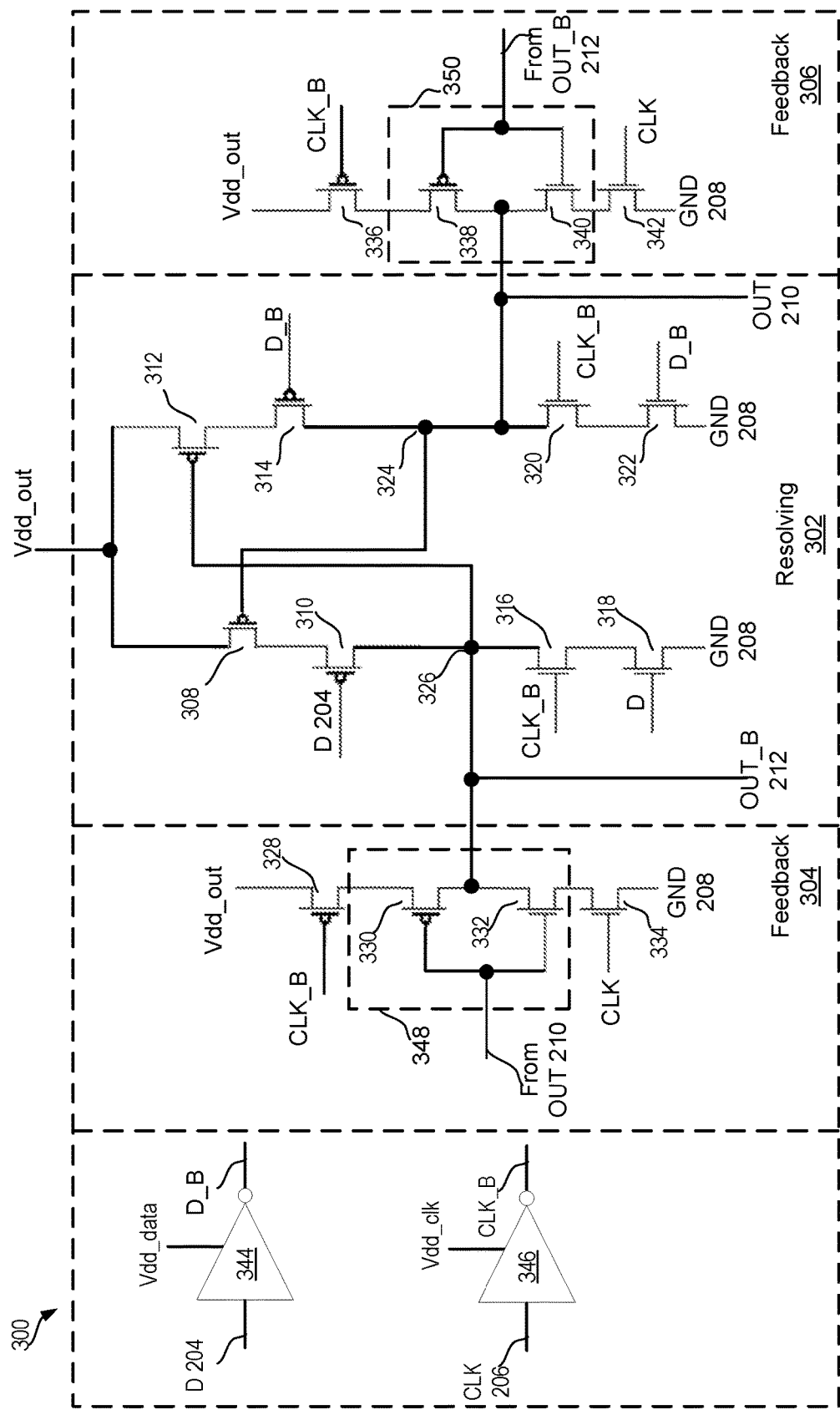
FIG. 3 is a block diagram illustrating an exemplary MVD latch circuit according to some embodiments of the present disclosure.
Figure 4:
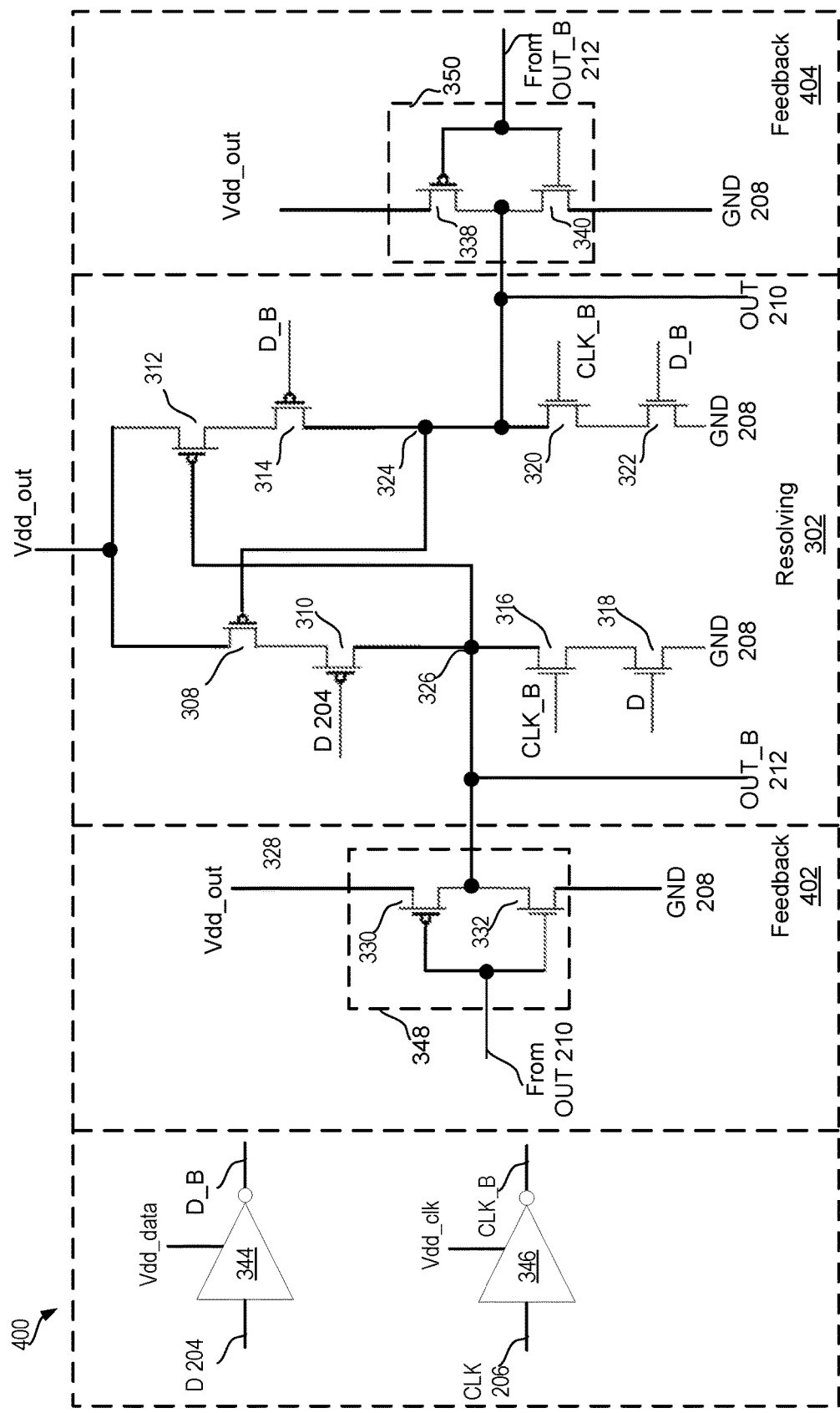
FIG. 4 is a block diagram illustrating another exemplary MVD latch circuit according to some embodiments of the present disclosure.
Figure 5:
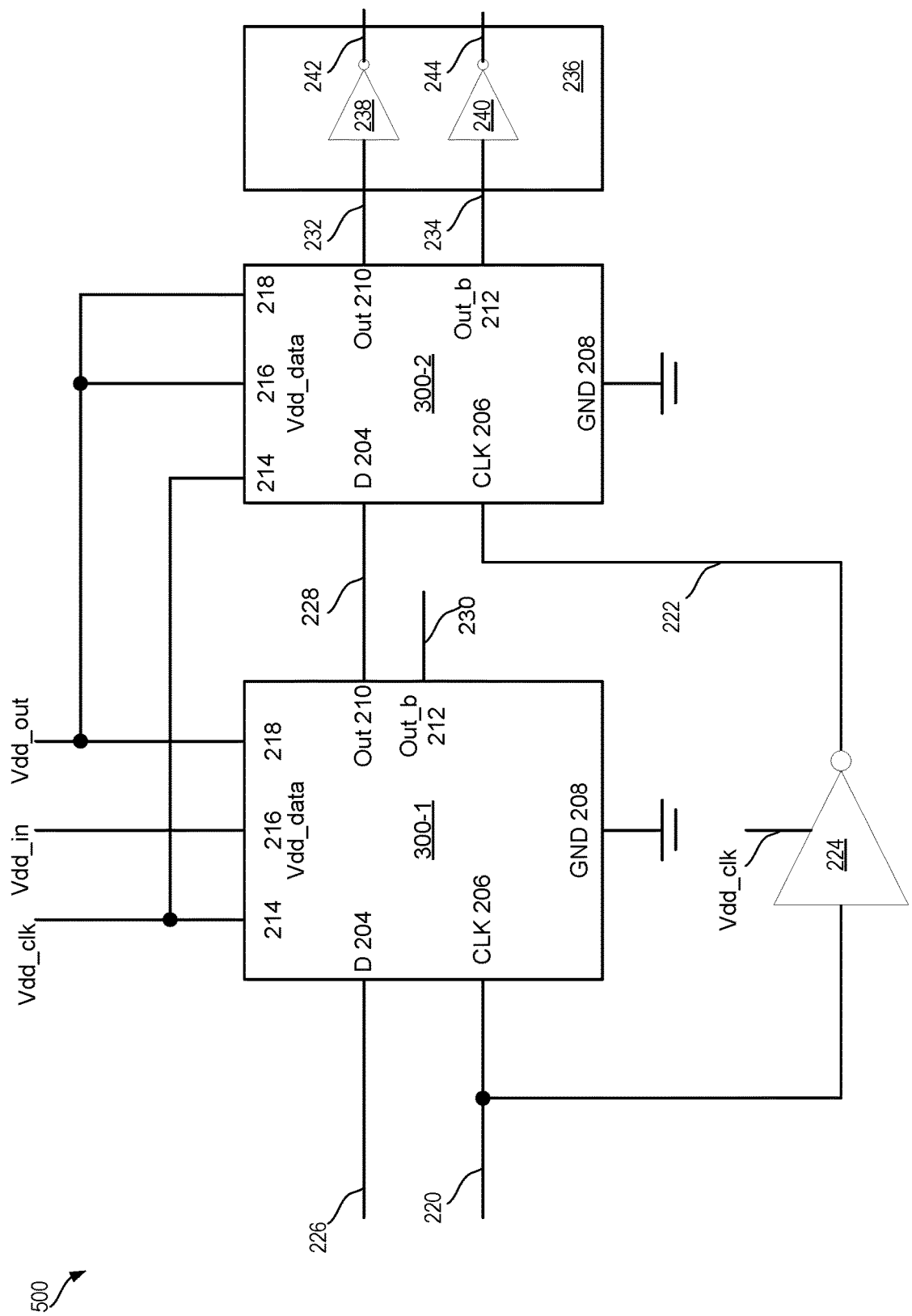
FIG. 5 is a block diagram illustrating an exemplary MVD FF circuit using the MVD latch circuit of FIG. 3 according to some embodiments of the present disclosure.
Figure 6:
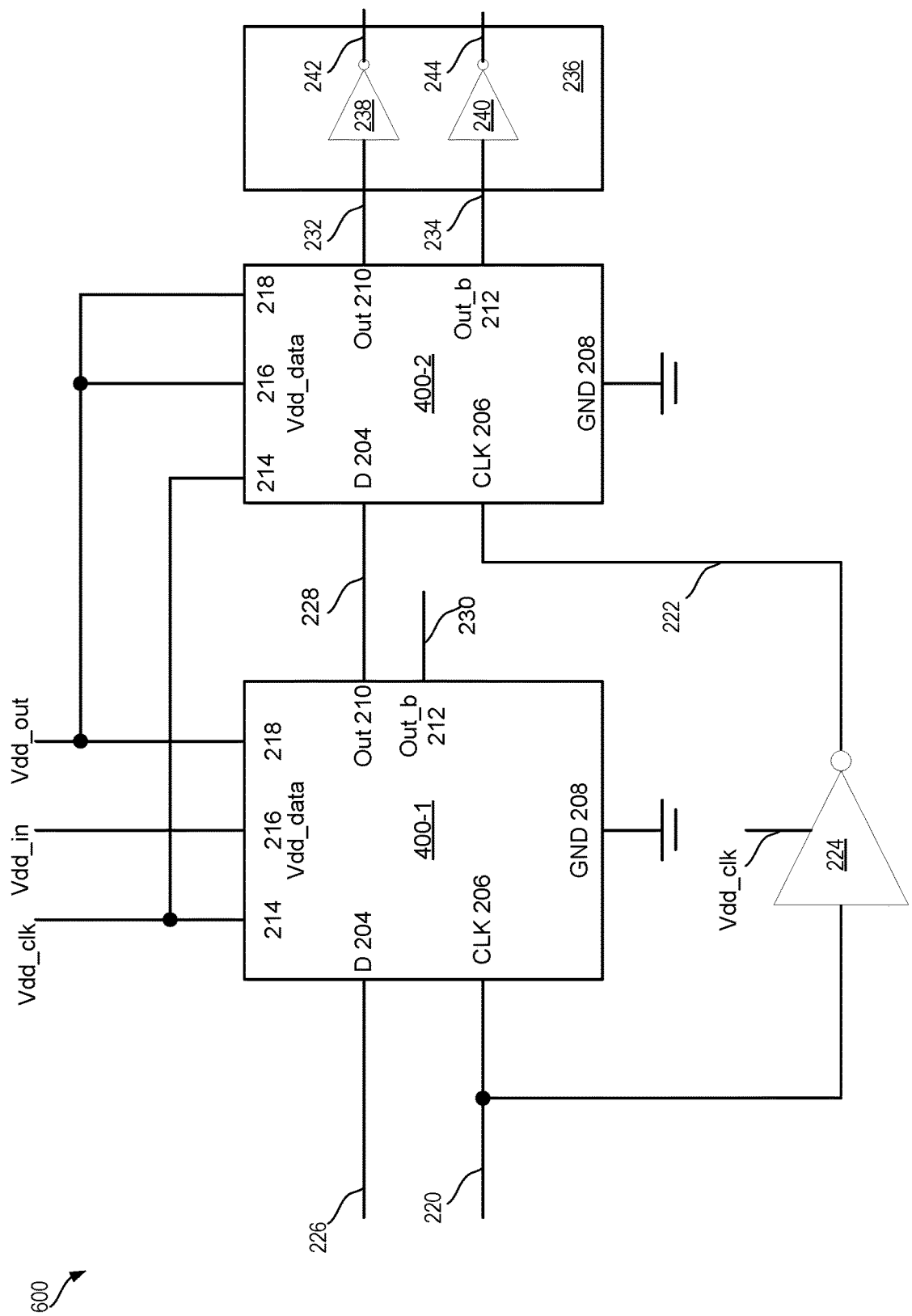
FIG. 6 is a block diagram illustrating an exemplary MVD FF circuit using the MVD latch circuit of FIG. 4 according to some embodiments of the present disclosure.
Figure 7A:
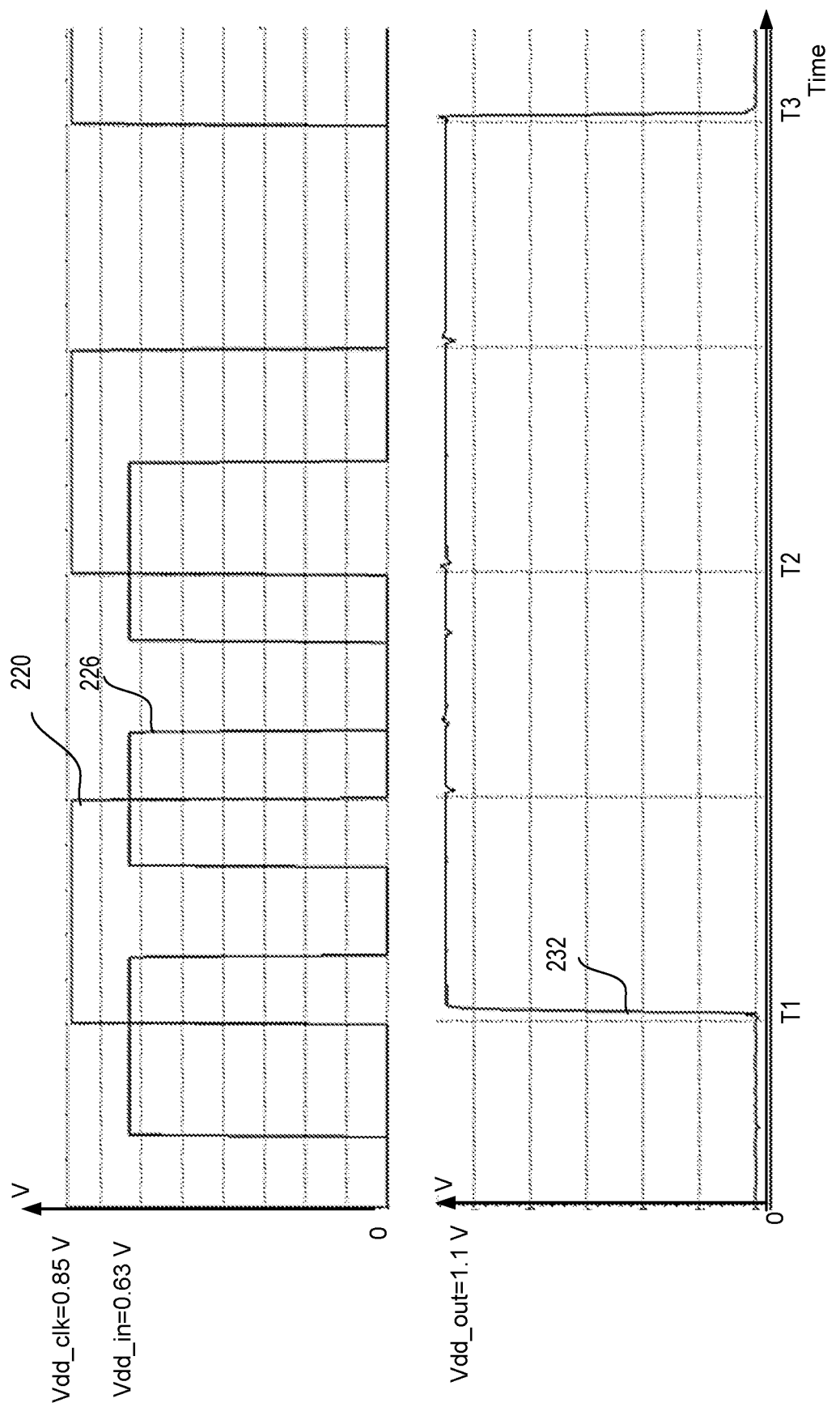
Figure 7B:
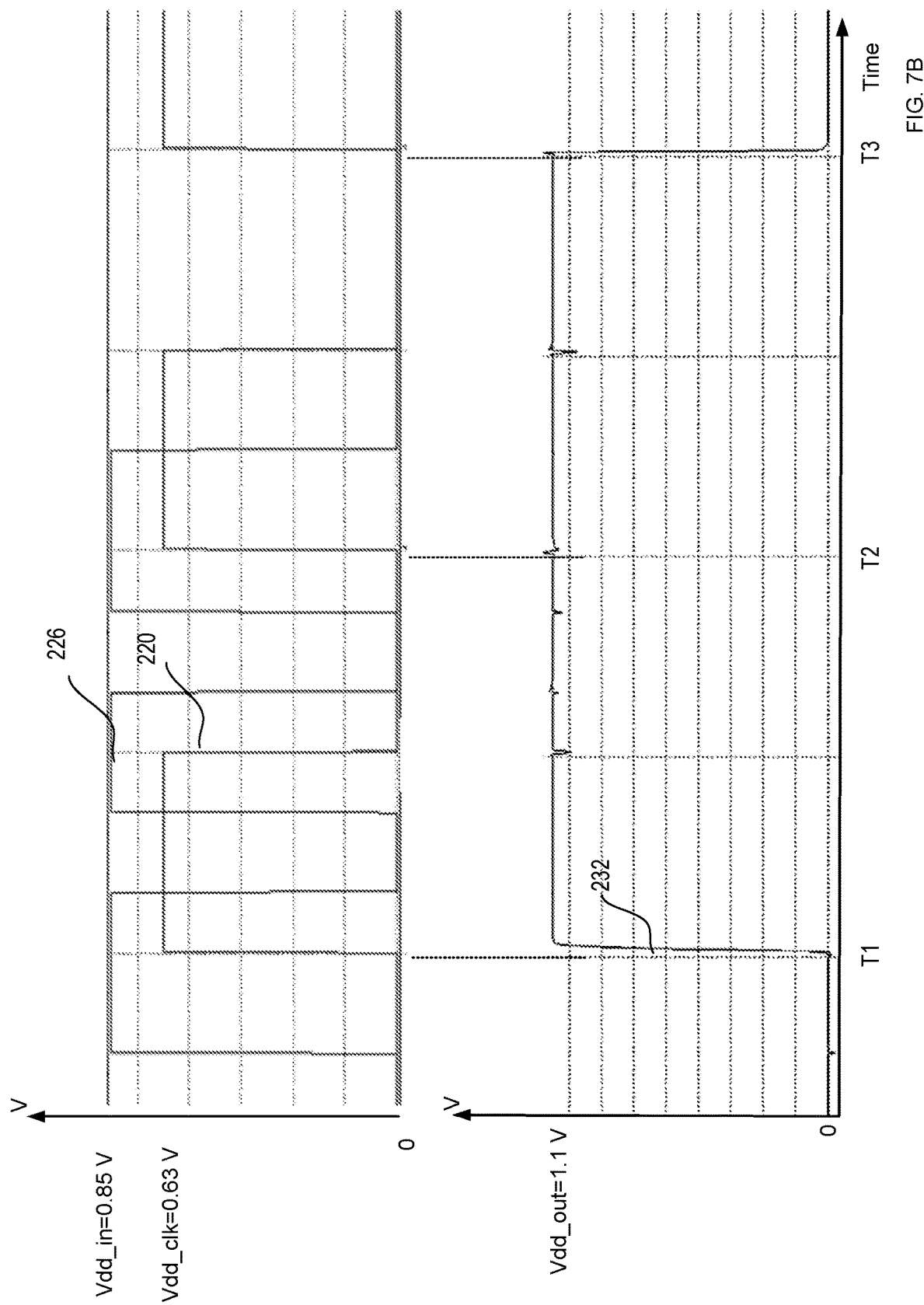
Figure 8:
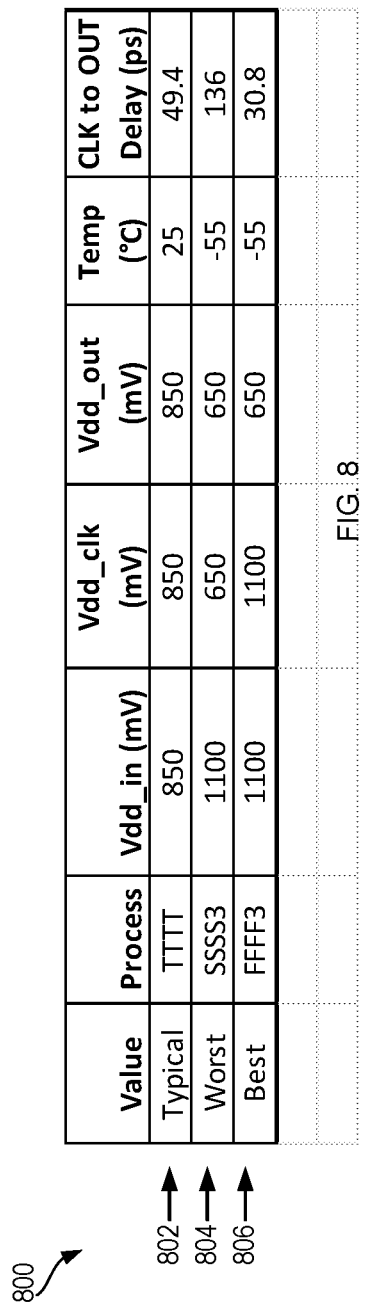
FIG. 8 is a table illustrating delays of the MVD FF circuit of FIG. 5 under various PVTs according to some embodiments of the present disclosure.
Figure 9:
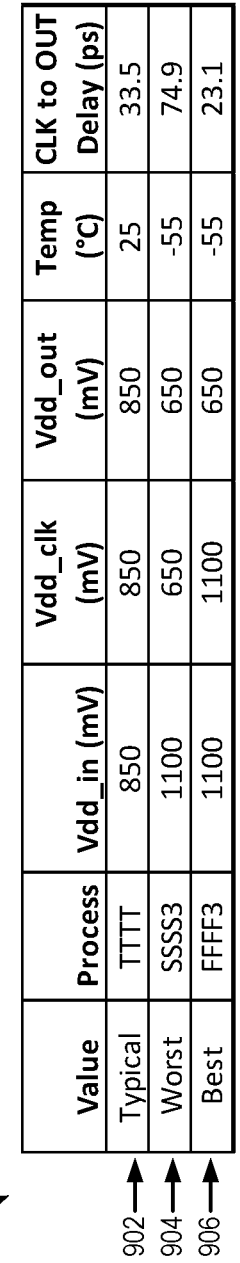
FIG. 9 is a table illustrating delays of the MVD FF circuit of FIG. 6 under various PVTs according to some embodiments of the present disclosure.

Referring to FIGS. 2 through 10, systems and methods for MVD latching are described. FIG. 2 illustrates an MVD FF including a master latch and a slave latch, where the MVD FF may perform latching with a clock signal and an input data signal that each may have a voltage domain that is different from an output data voltage domain. FIG. 3 illustrates an example of a latch circuit that may perform latching with a clock signal and an input data signal that each may have a voltage domain that is different from an output data voltage domain, where its feedback circuits use the clock signal. FIG. 4 illustrates another example of a latch circuit that may perform latching with a clock signal and an input data signal that each may have a voltage domain that is different from an output data voltage domain, where its feedback circuits do not use the clock signal. FIG. 5 illustrates an MVD FF using latch circuits of FIG. 3 in its master latch and slave latch respectively. FIG. 6 illustrates an MVD FF using latch circuits of FIG. 4 in its master latch and slave latch respectively. FIGS. 7A, 7B, and 7C illustrate waveforms of an MVD FF of FIG. 2 with different configurations of the clock voltage domain, input data voltage domain, and output data voltage domain. FIGS. 8, 9, and 10 illustrate the comparison of the delay, setup time, and hold time of MVD flip-flops of various configurations.

Referring to FIG. 2, an MVD FF 200 is illustrated. The MVD FF 200 is an edge sensitive memory element using latches in a "master-slave" configuration. The MVD FF 200 changes its logic state on the leading edge of a clock signal 220. The MVD FF 200 includes a master latch 202-1 and a slave latch 202-2. The slave latch clock signal 222 that drives the slave latch 202-2 is inverted from the clock signal 220 that drives the master latch 202-1. In an example, an inverter 224 receives the clock signal 220, and generates the slave latch clock signal 222 by inverting the clock signal 220.

As illustrated in FIG. 2, in various embodiments, each of the master latch 202-1 and slave latch 202-2 includes a data input 204 (D), a clock input 206 (CLK), a data output 210 (OUT), and a complementary data output 212 (OUT_B). A latch is a level sensitive device that is either transparent or opaque depending on the signal level of the clock received at the clock input 206. In some embodiments, when the clock input 206 is low, the latch is transparent, and the logic value (e.g., "0," "1") of the data input 204 is passed to the data output 210. In other words, when the clock input 206 is low, the data output 210 is logically equivalent to the data input 204. While the clock input 206 is high, the latch is opaque, and the data output 210 holds the previous input data.

Each of the master latch 202-1 and slave latch 202-2 includes voltage inputs 214, 216, and 218 for receiving voltages from voltages sources. Voltage input 214 is connected to a voltage source Vdd_clk, indicating that the clock signal voltage swing of a clock signal received from the clock input 206 is 0 V to Vdd_clk. Voltage input 218 is connected to a voltage source Vdd_out, indicating that an output data signal voltage swing of an output data signal output at the data output 210 is 0 V to Vdd_out. The complementary output data signal output at the complementary data output 212 also has the output data signal voltage swing.

The voltage input 216 is connected to a voltage source Vdd_data, indicating that an input data signal voltage swing of an input data signal received from the data input 204 is 0 V to Vdd_data. Note that in the example of FIG. 2, the voltage inputs 216 of the master latch 202-1 and slave latch 202-2 connect to different voltage sources Vdd_in and Vdd_out respectively. The master latch 202-1 receives an input data signal 226 at its data input 204 in a voltage domain of Vdd_in. As such, Vdd_data for voltage input 216 of the master latch 202-1 is Vdd_in, the voltage domain of the input data signal 226.

In some embodiments, the master latch 202-1 provides output data signal 228 (also referred to as an intermediate signal 228) in a voltage domain of Vdd_out at its output 210 and provides an inverted signal 230 of the output data signal 228 at its output 212. The slave latch 202-2 receives the output data signal 228 of the master latch 202-1 (also referred to as an intermediate signal 228) at its data input 204 in a voltage domain of Vdd_out. As such, Vdd_data for voltage input 216 of the slave latch 202-2 is Vdd_out, the voltage domain of the intermediate signal 228.

In some embodiments, voltages Vdd_clk, Vdd_data, and Vdd_out provided to a single latch are the same. In other embodiments, two or more of the voltages Vdd_clk, Vdd_data, and Vdd_out provided to a single latch are different from each other. As such, the master latch 202-1 and slave latch 202-2 may also be referred to as MVD latches 202-1 and 202-2 respectively. Each of the master latch 202-1 and slave latch 202-2 includes voltage input 208 connecting to ground.

In some embodiments, when the clock signal 220 is low, the master latch 202-1 is transparent, and the slave latch 202-2 is opaque. In other words, when clock signal 220 is low, the master latch 202-1 latches the input data signal 226 in the voltage domain Vdd_in, and outputs the intermediate signal 228 in the voltage domain Vdd_out that has the same logic value (e.g., "0" or "1") as the input data signal 226, thereby performing level shifting. When clock signal 220 is low, clock signal 222 sent to the clock input 206 of the slave latch 202-2 is high, and the slave latch 202-2 is opaque and holds the value of the previous data.

In some embodiments, when the clock signal 220 is high, the master latch 202-1 is opaque, and the slave latch 202-2 is transparent. In other words, when the clock signal 220 is high, the master latch 202-1 holds the previous input data, and the slave latch 202-2 performs latching the current data from the intermediate signal 228.

As such, by using the MVD FF 200 that includes the master latch 202-1 and slave latch 202-2, input data signal 226 is sampled on the rising edge of the clock signal 220, and is held steady at the output 210 until the next rising edge of the clock signal 220.

As shown in FIG. 2, in some embodiments, the MVD FF 200 includes a buffer stage 236 to buffer the output data signal 232 and the complementary output data signal 234. In the example of FIG. 2, the buffer stage 236 includes inverters 238 and 240 that generate output signals 242 and 244 respectively. The output signal 242 is logically equivalent to the output data signal 234, and the output signal 244 is logically equivalent to the output data signal 232. Such a buffer stage 236 may reduce loading on internal nodes of the MVD FF 200, which may reduce propagation delay.

In various embodiments, timing properties of the MVD FF 200 may be determined based on timing properties of the master latch 202-1 and the slave latch 202-2. In an example, the setup and hold times of the MVD FF 200 are the setup and hold times of the master latch 202-1, and the delay of the MVD FF 200 is the delay of the slave latch, assuming that the setup time is large enough so that the intermediate signal 228 is stable before the clock signal 220 rises.

Referring to the example of FIG. 3, an example latch circuit 300 is illustrated. The latch circuit 300 may be used in either or both of the master latch 202-1 and slave latch 202-2 of FIG. 2. The latch circuit 300 includes a resolving circuit 302 and feedback circuits 304 and 306, where the feedback circuits 304 and 306 are controlled by the clock input.

In the example of FIG. 3, the resolving circuit 302 includes PMOS transistors 308, 310, 312, and 314, and NMOS transistors 316, 318, 320, and 322. Sources of PMOS transistors 308 and 312 are connected to Vdd_out. The drain of PMOS transistor 308 is connected to the source of the PMOS transistor 310. The gate of PMOS transistor 308 is connected to a node 324, which provides the voltage at OUT. The drain of the PMOS transistor 310 is connected to node 326, which provides the voltage at OUT_B 212 that is complementary (opposite) of the OUT 210. The gate of the PMOS transistor 310 is connected to the data input 204.

The drain of PMOS transistor 312 is connected to the source of the PMOS transistor 314. The gate of PMOS transistor 312 is connected to the node 326 providing the OUT_B voltage. The drain of the PMOS transistor 314 is connected to node 324, which provides an OUT voltage that is complementary (opposite) of the OUT_B voltage. The gate of the PMOS transistor 314 is connected to a complementary signal D_B of the data input 204, which may be generated by an inverter 344.

The drain of the NMOS transistor 316 is connected to the node 326, the source of the NMOS transistor 316 is connected to the drain of the NMOS transistor 318. The gate of the NMOS transistor 316 is driven by CLK_B, which is complementary to the CLK 206. CLK_B may be generated using an inverter 346. The source of the NMOS transistor 318 is connected to GND, and the gate of the NMOS transistor 318 is driven by D.

The drain of the NMOS transistor 320 is connected to the node 324, the source of the NMOS transistor 320 is connected to the drain of the NMOS transistor 322. The gate of the NMOS transistor 320 is driven by CLK_B. The source of the NMOS transistor 322 is connected to GND, and the gate of the NMOS transistor 322 is driven by D_B.

In the example of FIG. 3, the feedback circuit 304 includes PMOS transistors 328 and 330 and NMOS transistors 332 and 334. The source of the PMOS transistor 328 is connected to Vdd_out, and the drain of the PMOS transistor 328 is connected to the source of the PMOS transistor 330. The gate of the PMOS transistor 328 is driven by CLK_B. The drain of the PMOS transistor 330 is connected to node 326, and the gate of the PMOS transistor 330 is driven by OUT.

The drain of the NMOS transistor 332 is connected to node 326, and the source of the NMOS transistor 332 is connected to the drain of the NMOS transistor 334. The gate of the NMOS transistor 332 is driven by OUT. The source of the NMOS transistor 334 is connected to GND, and the gate of the NMOS transistor 334 is driven by CLK.

In the example of FIG. 3, the feedback circuit 306 includes PMOS transistors 336 and 338 and NMOS transistors 340 and 342. The source of the PMOS transistor 336 is connected to Vdd_out, and the drain of the PMOS transistor 336 is connected to the source of the PMOS transistor 338. The gate of the PMOS transistor 336 is driven by CLK_B. The drain of the PMOS transistor 338 is connected to node 324, and the gate of the PMOS transistor 338 is driven by OUT_B.

The drain of the NMOS transistor 340 is connected to node 324, and the source of the NMOS transistor 340 is connected to the drain of the NMOS transistor 342. The gate of the NMOS transistor 340 is driven by OUT_B. The source of the NMOS transistor 342 is connected to GND, and the gate of the NMOS transistor 342 is driven by CLK.

In the latch circuit 300, the latching operations (e.g., performed by the feedback circuits 304 and 306) and resolving operation (e.g., performed by the resolving circuit 302) are mutually exclusive. When CLK received at clock input 206 is low (e.g., having a value of "0"), the feedback circuits 304 and 306 are off and the resolving circuit 302 is on. Specifically, when CLK is low, transistors 328, 334, 336, and 342 of feedback circuits 304 and 306 remain off, and transistors 316 and 320 of the resolving circuit 302 remain on. During this period where CLK is low, the values provided at OUT 210 and OUT_B 212 change according to the D value. Specifically, the resolving circuit 302 provides the signals at OUT 210 and OUT_B 212 based on the value received at D 204. When D has a value of "1" (e.g., at Vdd_data), transistors 314 and 318 are on, and transistors 310 and 322 are off. Node 326 is pulled to GND, thereby providing a logic low (e.g., 0 V) at the OUT_B. Further, transistor 312, whose gate is driven by node 326, is on. As such, node 324 is pulled to Vdd_out, thereby providing a logic high (e.g., Vdd_out) at OUT 210. When D has a value of "0" (e.g., at 0 V), transistors 314 and 318 are off, and transistors 310 and 322 are on. Node 324 is pulled to GND, thereby providing a logic low (e.g., 0 V) at the OUT 210. Further, transistor 308, whose gate is driven by node 324, is on. As such, node 326 is pulled to Vdd_out, thereby providing a logic high (e.g., Vdd_out) at OUT_B 212.

When CLK has a value of "1," the feedback circuits 304 and 306 are on, and the resolving circuit 302 is off. Specifically, when CLK is high (e.g., with a value of "1"), transistors 328, 334, 336, and 342 of feedback circuits 304 and 306 remain on, and transistors 316 and 320 of the resolving circuit 302 remain off. During this period where CLK has a value of "1," the values provided at OUT and OUT_B remain the same regardless the value received at D. Specifically, the feedback circuit 304 provides the signal at output OUT_B. Transistors 330 and 332 of the feedback circuit 304 operate as an inverter 348, generate an inverted value of the feedback signal received from OUT 210, and provide that inverted value at OUT_B 212. Similarly, the feedback circuit 306 provides the signal at OUT 210. Transistors 338 and 340 of the feedback circuit 306 operate as an inverter 350, generate an inverted value of the feedback signal received from OUT_B 212, and provide that inverted value at OUT 210.

In various embodiments, transistors 310 and 314 help to reduce the fight with the transistors 316 and 318 in stack and transistors 320 and 322 in stack. The benefits of transistors 310 and 314 may be illustrated using an example where a resolving circuit 302 does not use transistors 310 and 314. In that example where a resolving circuit 302 does not use transistors 310 and 314, the drain of the transistor 308 directly connects to the node 326, and the drain of the transistor 312 directly connects to the node 324. In that example, Vdd_out is 1.1 V and Vdd_clk and Vdd_data are 0.65 V. When both NMOS transistors 316 and 318 are on (e.g., CLK_B is high and D is high), $V_{gs}$ of the transistor 308 may be at −1.1 V (high overdrive). As such, the transistor 308 may fight with NMOS transistors 316 and 318 in series (e.g., with $V_{gs}$ at 0.65 V). Such a fight may make the design difficult when NMOS transistors 316 and 318 are not sized precisely. As such, to reduce the fight, each of NMOS transistors 316, 318, 320, and 322 may have a size greater than (e.g., by 3 to 6 times) the size of the PMOS transistor 308. On the other hand, as shown in the example of FIG. 3, by placing the PMOS transistor 310 between the drain of transistor 308 and node 326, when both NMOS transistors 316 and 318 are on, the absolute value of $V_{gs}$ of the transistor 308 is reduced (e.g., by 0.45 V, a difference between Vdd_data and Vdd_out). For example, with the addition of the PMOS transistor 310, the PMOS transistors 308 and 310 in stack make the pull up path to the node 326 weaker, and that pull up path may be controlled by the PMOS transistor 310 with a small $V_{gs}$ (e.g., with an absolute value less than $V_{gs}$ of the transistor 308). As such, by using the PMOS transistor pair 310 and 314, sizing requirements of NMOS transistors 316, 318, 320, and 322 may be relaxed or eliminated. In an example, NMOS transistors 316, 318, 320, and 322 may have a size that is the same as or less than three times of the size of a PMOS transistor (e.g., PMOS transistor 310).

Referring to the example of FIG. 4, another example of a latch circuit 400 is illustrated. The latch circuit 400 is substantially similar to the latch circuit 300 of FIG. 3 except the differences described below. The latch circuit 400 includes a resolving circuit 302 and feedback circuits 402 and 404. The feedback circuit 402 includes an inverter 348 that receives OUT and outputs OUT_B. The feedback circuit 404 includes an inverter 350 that receives OUT_B and outputs OUT. Unlike the feedback circuits 304 and 306 that are controlled by CLK, the feedback circuits 402 and 404 are always on, regardless of the CLK value.

In the latch circuit 400, the latching operation (e.g., performed by the feedback circuits 402 and 404) and resolving operation (e.g., performed by the resolving circuit 302) are performed simultaneously. In other words, the latching operation is always on regardless of the CLK value. Specifically, regardless of the CLK value, the inverter 348 of the feedback circuit 402 an inverted value of the feedback signal from OUT 210, and provides the inverted value at the output OUT_B 212. Similarly, regardless of the CLK value, the inverter 350 of the feedback circuit 404 receives a feedback signal from OUT_B 212, generates an inverted value of the feedback signal, and provides the inverted value of the feedback signal at OUT 210.

In the example of FIG. 4, the sizing of the pull down pair including NMOS transistors 316 and 318 and pull down pair including NMOS transistors 320 and 322 may be determined based on the transistors of the inverters 348 and 350. Unlike the latch circuit 300 of FIG. 3, as shown in FIG. 4, the keeper path (e.g., feedback circuits 402 and 404) of latch circuit 400 is not controlled by CLK. As such, the discharging path including NMOS transistors 316 and 318 needs to win over the charging path including PMOS transistors 308 and 310. The discharging path including NMOS transistors 316 and 318 also needs to win over the charging path of the inverter 348 that includes PMOS transistor 330. As such, each of the NMOS transistors 316 and 318 may be of a size greater than (e.g., by about 3 to 6 times) the size of the PMOS transistor 330. Similarly, each of the NMOS transistors 320 and 322 may be of a size greater than (e.g., by about 3 to 6 times) the size of the PMOS transistor 338 of the inverter 350.

Referring to FIG. 5, in some embodiments, an MVD FF 500 (e.g., an MVD FF 200 of FIG. 2) may use two identical latch circuits 300 of FIG. 3 in its master latch and slave latch. Specifically, the MVD FF 500 includes a master latch circuit 300-1 (e.g., a latch circuit 300 of FIG. 3) and a slave latch circuit 300-2 (e.g., another latch circuit 300 of FIG. 3). In such an MVD FF 500 using latches 300-1 and 300-2, a fast resolving time is achieved. The setup time and hold time of the MVD FF 500 is comparable to a level shifting system that includes separate level shifters for clock shifting and input data shifting in addition to a flip-flop. By not using separate level shifters for clock and input data, the MVD FF 500 achieves area saving (e.g., of about 50% or more compared to the level shifting system with two separate level shifters) and power saving. Better writability is achieved because of the reduced contention between latching (e.g., using feedback circuits 304 and 306) and resolving (e.g., using resolving circuit 302) of each latch circuit 300 by using CLK to control the feedback circuits 304 and 306 and/or by using the transistors 310 and 314 in the resolving circuit 302. The MVD FF 500 is highly robust across PVT for skewed clocks, input data and output data.

Referring to FIG. 6, in some embodiments, an MVD FF 600 (e.g., an MVD FF 200 of FIG. 2) may use two identical latch circuits 400 of FIG. 4 in its master latch and slave latch. Specifically, the MVD FF 600 includes a master latch 400-1 (e.g., a latch 400 of FIG. 4) and a slave latch 400-2 (e.g., another latch 400 of FIG. 4). In such an MVD FF 600 using latches 400-1 and 400-2, a fast resolving time is achieved. The setup time and hold time of the MVD FF 600 is comparable to a level shifting system that includes separate level shifters for clock shifting and input data shifting in addition to a flip-flop. By not using separate level shifters for clock and input data, the MVD FF 600 achieves area saving (e.g., of about 20% or more compared to the level shifting system with two separate level shifters) and power saving. The MVD FF 600 is highly robust across PVT for skewed clocks, input data and output data. Compared to MVD FF 500 of FIG. 5, MVD FF 600 has less loading on the clock signal.

Referring to FIGS. 7A, 7B, and 7C, waveforms for clock signal 220, input data signal 226, and output data signal 232 of an MVD FF 500 of FIG. 5 are illustrated. Waveforms for clock signal 220, input data signal 226, and output data signal 232 of an MVD FF 600 of FIG. 6 are substantially similar to those of FIGS. 7A, 7B, and 7C. FIG. 7A illustrates a transition from a clock signal voltage domain level (Vdd_clk=0.85 V) and a data input voltage domain level (Vdd_in=0.63 V) to a higher data output voltage domain level (Vdd_out=1.1 V). FIG. 7B illustrates a transition from a clock signal voltage domain level (Vdd_clk=0.63 V) and a data input voltage domain level (Vdd_in=0.85 V) to a higher data output voltage domain level (Vdd_out=1.1 V). FIG. 7C illustrates a transition from a clock signal voltage domain level (Vdd_clk=1.1 V) and a data input voltage domain level (Vdd_in=0.9 V) to a lower data output voltage domain level (Vdd_out=0.85 V).

As shown in FIGS. 7A, 7B, and 7C, regardless of the different voltage domain level configurations, at the first rising edge of the clock signal 220 at time T1, the value ("1") of input data signal 226 is passed to the output data signal 232 in the data output voltage domain. The high output value is maintained to time T2. At the second rising edge of the clock signal 220 at time T2, the value ("1") of input data signal 226 is passed to the output data signal 232 in the data output voltage domain. That high output value is maintained to time T3. At the third rising edge of the clock signal 220 at time T3, the value ("0") of input data signal 226 is passed to the output data signal 232 in the data output voltage domain. It is noted that while specific examples are used, Vdd_clk, Vdd_in, Vdd_out may have any suitable values that are the same or different from each other (e.g., values between 0.65 V and 1.1 V or any other suitable values).

Referring to FIG. 8, a table 800 illustrates performance of an example MVD FF 500 of FIG. 5 under various PVT. As shown in row 802, under a typical case (e.g., with a process corner of "TTTT," Vdd_in of 0.85 V, Vdd_clk of 0.85 V, Vdd_out of 0.85 V, and a temperature of 25° C.), an MVD FF 500 has a CLK to OUT delay of 49.4 ps. This CLK to OUT delay is reduced (e.g., by about 30% or more) from the CLK to OUT delay of the level shift system including two level shifters and an FF under the same PVT. As shown in row 804, under the worst case (e.g., with a process corner of "SSSS3," Vdd_in of 1.1 V, Vdd_clk of 0.65 V, Vdd_out of 0.65 V, and a temperature of −55° C.), an MVD FF 500 has a CLK to OUT delay of 136 ps. As shown in row 806, under the best case (e.g., with a process corner of "FFFF3," Vdd_in of 1.1 V, Vdd_clk of 1.1 V, Vdd_out of 0.65 V, and a temperature of −55° C.), an MVD FF 500 has a CLK to OUT delay of 30.8 ps.

Referring to FIG. 9, a table 900 illustrates performance of an example MVD FF 600 of FIG. 6 under various PVT. As shown in row 902, under a typical case (e.g., with a process corner of "TTTT," Vdd_in of 0.85 V, Vdd_clk of 0.85 V, Vdd_out of 0.85 V, and a temperature of 25° C.), an MVD FF 600 has a CLK to OUT delay of 33.5 ps. As shown in row 904, under the worst case (e.g., with a process corner of "SSSS3," Vdd_in of 1.1 V, Vdd_clk of 0.65 V, Vdd_out of 0.65 V, and a temperature of −55° C.), an MVD FF 500 has a CLK to OUT delay of 74.9 ps. Such a CLK to OUT delay is reduced (by about 60%) from the level shift system that includes two level shifters and an FF under the same PVT. As shown in row 906, under the best case (e.g., with a process corner of "FFFF3," Vdd_in of 1.1 V, Vdd_clk of 1.1 V, Vdd_out of 0.65 V, and a temperature of −55° C.), an MVD FF 500 has a CLK to OUT delay of 23.1 ps.

Referring to FIG. 10, a table 1000 illustrates that MVD FF 500 and MVD FF 600 have comparable setup time and hold time compared to a level shift system that includes separate level shifters for the clock signal and input data signal in addition to an FF. As shown in row 902, such a level shift system has a setup time of 35 picoseconds (ps) and a hold time of 0 ps. As shown in row 904, MVD FF 500 of FIG. 5 has a setup time of 60 ps and a hold time of 0 ps. As shown in row 906, MVD FF 600 of FIG. 6 has a setup time of 30 ps and a hold time of 0 ps.

It is noted that various configurations illustrated in FIGS. 2 to 10 are exemplary only and not intended to be limiting beyond what is specifically recited in the claims that follow. It will be understood by those skilled in that art that other configurations may be used. While in the illustrated examples an MVD FF uses identical latch circuits in its master latch circuit and slave latch circuit, the master latch circuit and slave latch circuit may use different latch circuits. For example, an MVD FF 200 may use one of a latch circuit 300 of FIG. 3 and a latch circuit of FIG. 4 in its master latch circuit 202-1, and use the other of the latch circuit 300 of FIG. 3 and the latch circuit of FIG. 4 in its slave latch circuit 202-2. For further example, while specific example voltage domains are used for Vdd_clk, Vdd_in, Vdd_data, and/or Vdd_out, any suitable voltage domains may be used for Vdd_clk, Vdd_in, Vdd_data, and/or Vdd_out.

One or more elements in the various embodiments may be implemented by software, hardware (e.g., an application specific integrated circuit (ASIC), application-specific standard parts (ASSPs), a logic on a programmable logic IC (e.g., FPGA)), firmware, and/or a combination thereof. The embodiments may be implemented using various hardware resources, such as for example DSP slices, BRAM, and programmable resources of an FPGA; however, in other embodiments, digital signal processors, microprocessors, multi-core processors, memory, and/or other hardware may be used. When implemented in software, the elements of the embodiments of the invention are essentially the code segments to perform the necessary tasks. The program or code segments can be stored in a processor-readable storage medium or device that may have been downloaded by way of a computer data signal embodied in a carrier wave over a transmission medium or a communication link. The processor readable storage device may include any medium that can store information including an optical medium, semiconductor medium, and magnetic medium. Processor readable storage device examples include an electronic circuit; a semiconductor device, a semiconductor memory device, a read-only memory (ROM), a flash memory, an erasable programmable read-only memory (EPROM); a floppy diskette, a CD-ROM, an optical disk, a hard disk, or other storage device, The code segments may be downloaded via computer networks such as the Internet, Intranet, etc.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. A circuit, comprising:
a master latch circuit, including:
a first voltage input configured to connect to a first voltage source of a first voltage domain;
a second voltage input configured to connect to a second voltage source of a second voltage domain;
a master data input configured to receive an input data signal in the first voltage domain;
a first output configured to provide a first master output data signal in the second voltage domain;
a second output configured to provide a second master output data signal in the second voltage domain;
a resolving circuit including:
first and second PMOS transistors connected in serial, wherein a gate of the second PMOS transistor is coupled to the input data signal; and
third and fourth PMOS transistors connected in serial, wherein a gate of the first PMOS transistor is coupled to a drain of the fourth PMOS transistor, and wherein a drain of the fourth PMOS transistor is coupled to the first output of the master latch circuit,
wherein the resolving circuit is configured to, in response to a first value of a first clock signal, provide, at the first output of the master latch circuit, the first master output data signal that is logically equivalent to the input data signal;
a first feedback circuit configured to;
provide to the second output, using a first inverter, a first feedback signal that is an inverted signal of the first master output data signal; and
a second feedback circuit configured to:
receive, from the second output, the second master output data signal, and provide to the first output, using a second inverter, a second feedback signal that is an inverted signal of the second master output data signal;
and
a slave latch circuit, separate from the master latch circuit, the slave latch circuit including:
a slave data input configured to receive, from the master latch circuit, the first master output data signal; and
a first output configured to provide a first slave output data signal in the second voltage domain.

2. The circuit of claim 1, wherein the master latch circuit includes:
a clock voltage input configured to connect to a clock voltage source of a clock voltage domain; and
a clock input configured to receive a first clock signal in the clock voltage domain,
wherein the first master output data signal is generated based on the first clock signal,
wherein the slave latch circuit is configured to receive an inverted signal of the first clock signal, and
wherein the first slave output data signal is generated based on the inverted signal of the first clock signal.

3. The circuit of claim 2, wherein the clock voltage domain is different from at least one of the first voltage domain and second voltage domain.

4. The circuit of claim 2, wherein the
resolving circuit s configured to, in response to the first value of the first clock signal:
provide, at the second output of the master latch circuit, the second master output data signal that is an inverted signal of the first master output data signal.

5. The circuit of claim 4,
wherein a drain of the first PMOS transistor is coupled to a source of the second PMOS transistor;
wherein a drain of the third PMOS transistor is coupled to a source of the fourth PMOS transistor;
wherein a gate of the third PMOS transistor is coupled to a drain of the second PMOS transistor,
wherein a gate of the fourth PMOS transistor is coupled to an inverted signal of the input data signal, and
wherein a drain of the second PMOS transistor is coupled to the second output of the master latch circuit.

6. The circuit of claim 5, wherein the resolving circuit includes:
first and second NMOS transistors connected in serial, wherein a drain of the first NMOS transistor is coupled to the drain of the second PMOS transistor, and where a gate of the first NMOS transistor is coupled to an inverted signal of the first clock signal; and third and fourth NMOS transistors connected in serial, wherein a drain of the third NMOS transistor is coupled to the drain of the fourth PMOS transistor.

7. The circuit of claim 1, wherein at least one of the first feedback circuit and second feedback circuit is controlled by the first clock signal received by the master latch circuit.

8. The circuit of claim 7, wherein each of the first inverter and second inverter is off when the first clock signal is the first value.

9. The circuit of claim 7, further comprising:

first and second NMOS transistors connected in serial, wherein a drain of the first NMOS transistor is coupled to a drain of the second PMOS transistor, and where a gate of the first NMOS transistor is coupled to an inverted signal of the first clock signal;

third and fourth NMOS transistors connected in serial, wherein a drain of the third NMOS transistor is coupled to a drain of the fourth PMOS transistor;

wherein at least one of the first, second, third, and fourth NMOS transistors has a size determined based on a size of a transistor of one of the first and second inverters.

10. The circuit of claim 7, wherein each of the first inverter and second inverter remains on during an entire clock cycle of the first clock signal.

11. A method, comprising:

receiving, using a first voltage input of a master latch circuit, a first voltage source of a first voltage domain;

receiving, using a second voltage input of the master latch circuit, a second voltage source of a second voltage domain different from the first voltage domain;

receiving, by a data input of the master latch circuit, an input data signal in the first voltage domain;

providing to a first output of the master latch circuit, by a resolving circuit of the master latch circuit, a first master output data signal in the second voltage domain;

wherein the resolving circuit includes:

first and second PMOS transistors connected in serial, wherein a gate of the second PMOS transistor is coupled to the input data signal; and third and fourth PMOS transistors connected in serial, wherein a gate of the first PMOS transistor is coupled to a drain of the fourth PMOS transistor, and wherein a drain of the fourth PMOS transistor is coupled to the first output of the master latch circuit;

providing to the second output of the master latch circuit, by a first feedback circuit, having a first inverter, of the master latch circuit, a first feedback signal that is an inverted signal of the first master output data signal;

providing to the first output of the master latch circuit, by a second feedback circuit, having a second inverter, of the master latch circuit, a second feedback signal that is an inverted signal of the second master output data signal;

receiving, by a slave latch circuit that is separate from the master latch circuit, the master output data signal; and generating, by the slave latch circuit, a slave output data signal associated with the second voltage domain.

12. The method of claim 11, further comprising:

receiving, using a clock voltage input of the master latch circuit, a clock voltage source of a clock voltage domain, wherein the clock voltage domain is different from at least one of the first and second voltage domains;

receiving, by the master latch circuit, a first clock signal in the clock voltage domain, wherein the master output data signal is generated based on the first clock signal; and receiving, by the slave latch circuit, an inverted signal of the first clock signal, wherein the slave output data signal is generated based the inverted signal of the first clock signal.

13. The method of claim 11, wherein the second master output data signal is an inverted signal of the first master output data signal.

14. The method of claim 12, further comprising controlling at least one of the first feedback circuit and the second feedback circuit by the first clock signal received by the master latch circuit.

15. The method of claim 14, further comprising at least one of:

turning each of the first inverter and the second inverter off when the first clock signal is low; or keeping each of the first inverter and second inverter on during an entire clock cycle of the first clock signal.

16. The method of claim 11, further comprising receiving a first clock signal in the clock voltage domain; and in response to a low value of the first clock signal:

providing, at the first output of the master latch circuit, a first master output data signal that is logically equivalent to the input data signal; and providing, at the second output of the master latch circuit, a second master output data signal that is an inverted signal of the first master output data signal.

\* \* \* \* \*

UNITED STATES PATENT AND TRADEMARK OFFICE
CERTIFICATE OF CORRECTION

| | | |
|---|---|---|
| PATENT NO. | : 10,979,034 B1 | Page 1 of 1 |
| APPLICATION NO. | : 16/012557 | |
| DATED | : April 13, 2021 | |
| INVENTOR(S) | : Kumar Rahul et al. | |

It is certified that error appears in the above-identified patent and that said Letters Patent is hereby corrected as shown below:

In the Claims

Column 16, Line 47, In Claim 4, delete "s" and insert -- is --, therefor.

Column 18, Line 23, In Claim 12, after "based" insert -- on --.

Signed and Sealed this
Twenty-fourth Day of August, 2021

Drew Hirshfeld
*Performing the Functions and Duties of the
Under Secretary of Commerce for Intellectual Property and
Director of the United States Patent and Trademark Office*